United States Patent
McEwan

[19]

[11] Patent Number: 6,055,287
[45] Date of Patent: Apr. 25, 2000

[54] PHASE-COMPARATOR-LESS DELAY LOCKED LOOP

[76] Inventor: Thomas E. McEwan, 1734 Cairo St., Livermore, Calif. 94550

[21] Appl. No.: 09/084,541

[22] Filed: May 26, 1998

[51] Int. Cl.[7] .................................................. H03L 7/06
[52] U.S. Cl. .......................... 375/376; 327/156; 327/158
[58] Field of Search ................................. 375/371, 376; 370/503, 517; 327/156, 158, 161, 250; 713/400

[56] References Cited

U.S. PATENT DOCUMENTS

| | | | |
|---|---|---|---|
| 4,095,186 | 6/1978 | Vesel | 328/133 |
| 4,495,468 | 1/1985 | Richards et al. | 328/155 |
| 4,652,778 | 3/1987 | Hosoya et al. | 307/603 |
| 4,677,395 | 6/1987 | Baker | 331/25 |
| 4,922,141 | 5/1990 | Lofgren et al. | 307/595 |
| 5,043,596 | 8/1991 | Masuda et al. | 307/262 |
| 5,118,975 | 6/1992 | Hillis et al. | 307/602 |
| 5,146,121 | 9/1992 | Searles et al. | 307/603 |
| 5,216,302 | 6/1993 | Tanizawa | 307/603 |
| 5,345,119 | 9/1994 | Khoury | 327/553 |
| 5,463,337 | 10/1995 | Leonowich | 327/158 |
| 5,563,605 | 10/1996 | McEwan | 342/202 |
| 5,646,564 | 7/1997 | Erickson et al. | 327/158 |
| 5,670,903 | 9/1997 | Mizuno | 327/158 |
| 5,687,202 | 11/1997 | Eitrheim | 375/376 |
| 5,825,226 | 10/1998 | Ferraiolo et al. | 327/250 |

FOREIGN PATENT DOCUMENTS

| | | | |
|---|---|---|---|
| WO91/13370 | 5/1991 | WIPO | G01S 13/04 |

*Primary Examiner*—Don N. Vo
*Attorney, Agent, or Firm*—Haynes & Beffel LLP

[57] ABSTRACT

A delay locked loop clock circuit employs an analog control loop for generating picosecond-accurate clock delays. A linear analog comparison circuit operating on integrated DC levels replaces the usual digital phase comparator for substantially improved timing accuracy. In operation, clock pulses from a first delay path are integrated and applied to a loop control amplifier. Clock pulses from a second delay path are integrated and applied to a differencing input of the loop control amplifier. The loop control amplifier regulates the delay in the second delay path to balance the integrated clock pulse voltages against externally applied control voltages. The delay between the first path and the second path is thereby precisely controlled by external voltage inputs. The first and second path clock output timing relationship is directly measured by analog voltage devices, eliminating error-prone high-speed phase comparators employed in prior art approaches.

20 Claims, 3 Drawing Sheets

PHASE-COMPARATOR-LESS DELAY LOCKED LOOP

BACKGROUND OF THE INVENTION

1. Field of the Invention

The present invention relates to electronically controlled delay circuits, and more particularly to high-speed voltage-controlled delay locked loops. The invention can be used to generate a swept-delay clock for sampling-type radar, TDR and laser receivers.

2. Description of Related Art

High range resolution pulse-echo systems such as wideband pulsed radar, pulsed laser rangefinders, and time domain reflectometers often sweep a timing circuit across a range of delays. The timing circuit controls a receiver sampling gate such that when an echo signal coincides with the temporal location of the sampling gate, a sampled echo signal is obtained. The range of the sampled echo is directly determined from the timing circuit, so highly accurate timing is needed to obtain high accuracy range information.

Timing circuits are implemented with both open loop and closed loop control architectures. Open loop timing circuits often use an analog voltage ramp to drive a comparator, with a comparator reference voltage controlling the delay. Open loop circuits are subject to component and temperature variations, and are not very accurate due to the difficulty in generating a precision voltage ramp with sub-nanosecond accuracy.

Closed loop timing circuits are generally a variation on a phase-locked loop (PLL)—the delay locked loop (DLL). The difference between a PLL and a DLL is often a matter of definition—the DLL controls the relative delay between two digital waveforms, which can also be considered to be relative phase. In the present invention, the primary attribute of interest is the time difference between the two waveforms, so the term DLL is appropriate.

DLL circuits are often used to control clock skew on LSI chips, or to generate multi-phase clocks for digital computing applications. Generally, digital computer clock circuits do not need the sub-10 ps accuracy required of radar and laser rangefinders with 1-mm range accuracy. Thus, most prior art circuits do not address the accuracy needed for the intended applications of the present invention.

A prior art DLL circuit operates by 1) comparing the phase of two clock waveforms using a phase comparator, such as an X-OR gate, 2) integrating the phase comparator output to obtain a DC voltage indicative of the phase difference between the two clocks, and 3) applying the DC voltage to an amplifier whose output controls the phase shift or time delay through one of the clock paths.

All known PLL and DLL circuits employ phase comparators, which limit the accuracy of the entire circuit. A particular problem with phase comparators using digital gates is edge crosstalk between the two input clocks. Edge crosstalk typically occurs in the 0 and 180 degree regions and can produce an error of 0.1 nanoseconds or more, depending on edge speeds and coupling factors. Another major error occurs when the comparator output is a digital pulse of diminishing width—the comparator output cannot produce a 0-ns wide pulse at its output. Further, digital phase comparators can introduce temporal error due to gate propagation delay changes, and inaccuracies due to pulse ringing and other aberrations. It is very difficult to obtain delay accuracies in the range of 1–10 picoseconds due to phase comparator limitations.

A "Precision Digital Pulse Phase Generator" is disclosed by McEwan in U.S. Pat. No. 5,563,605 which employs a 1-micron NAND gate as a phase comparator in a DLL configuration. The NAND gate must operate with at least 4-ns of clock timing difference to allow for the propagation of a 4-ns or wider pulse through it. This presents a problem for radar circuits that must operate down to zero range, such as for fluid level measurement in a tank, since the 4-ns minimum delay represents 66 cm minimum radar range. Furthermore, the accuracy of the NAND gate phase comparator is highly suspect, since the NAND gate has a 2-ns propagation delay, which is 1000× higher than the desired circuit accuracy of ~2 ps.

The present invention significantly advances the accuracy of DLL circuits by eliminating the phase comparator altogether.

SUMMARY OF THE INVENTION

The present invention is a precision voltage controlled delay circuit for radar, laser and Time Domain Reflectometer (TDR) range gate circuits. In the delay circuit, a Pulse Repetition Frequency (PRF) clock drives a reference delay element and a variable delay element. These delay elements are gated such that their outputs are variable pulse widths, with the pulse width being a function of the time delay introduced by each respective element.

The variable pulse width outputs are integrated to provide a DC voltage corresponding to the delay introduced by each delay element. These DC voltages are then compared by means of a conventional analog operational amplifier circuit to provide a control voltage that precisely regulates the relative delay between the two delay elements. The phase comparator found in conventional PLL and DLL circuits is thereby eliminated and replaced with an analog voltage comparison circuit. Thus, the temporal errors introduced by a phase comparator are eliminated.

A primary object of the present invention is to provide a voltage-controlled timing circuit with a typical accuracy of 10-ps over a range of delays of typically 0 to 100 ns. In a rangefinder application, the rangefinding accuracy provided by the present invention is on the order of 1.5 mm over a 0 to 15-meter range span, or 0.01% of full scale.

Another object of the present invention is to provide an implementation with a minimum of components to facilitate widespread use in low-cost commercial and consumer rangefinding applications. Since the present invention is comprised of simple CMOS logic gates and operational amplifiers, it is a model of simplicity.

The present invention can be used in low cost radars for security alarms, home automation and lighting control, industrial and robotic controls, automatic toilet and faucet control, automatic door openers, fluid level sensing radars, imaging radars, vehicle backup warning and collision radars, and general appliance control.

In another embodiment utilizing the present invention, a time domain reflectometer where an impulse is propagated along a conductor or guidewire can be realized for use in a variety of applications, such as an "electronic dipstick" for fluid level sensing.

DETAILED DESCRIPTION OF THE INVENTION

A detailed description of the present invention is provided below with reference to the figures. While illustrative component values and circuit parameters are given, other embodiments can be constructed with other component values and circuit parameters.

Figure 1:
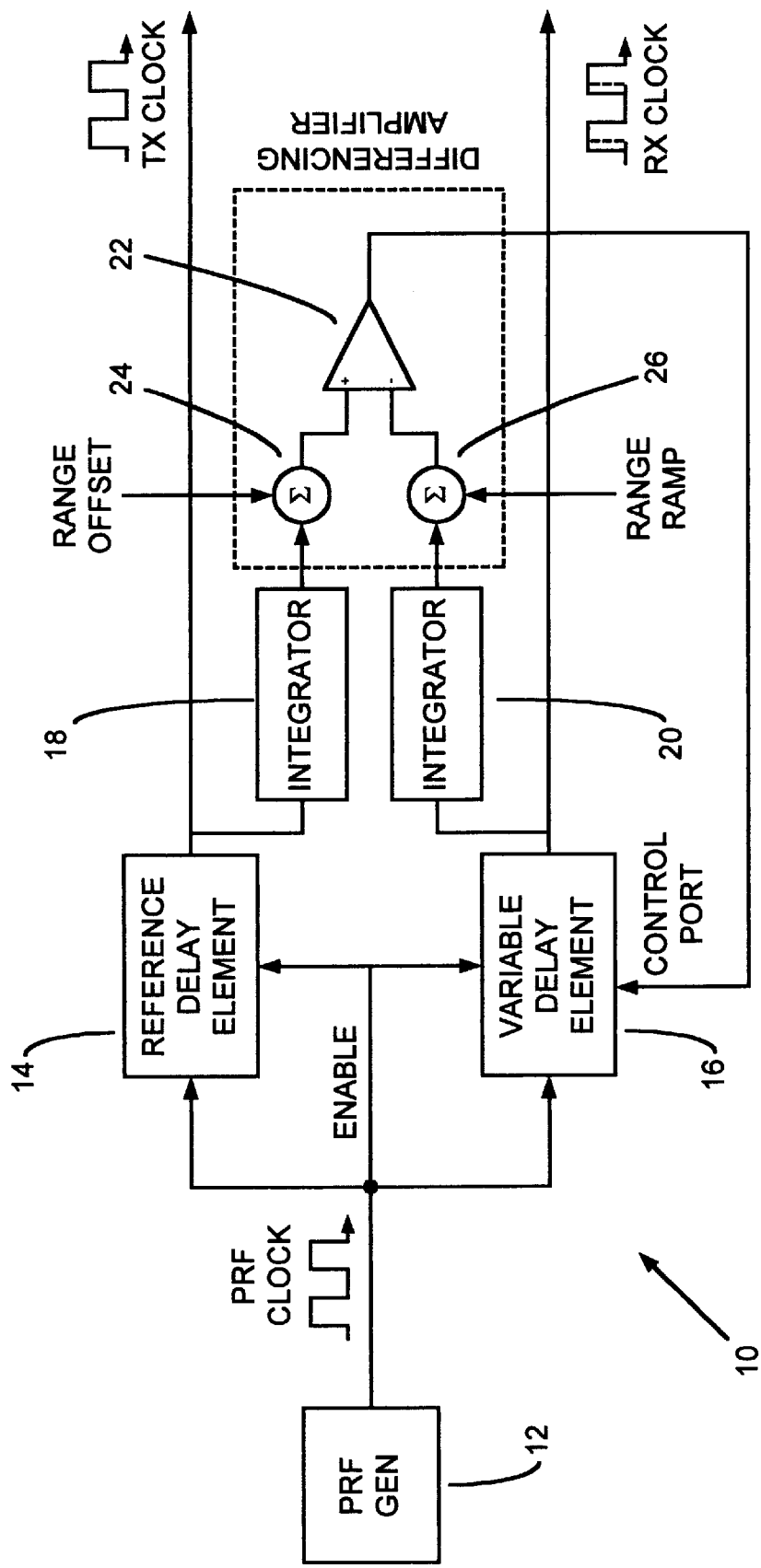
FIG. 1 is a block diagram of a dual-path clock-delay circuit of the present invention.

FIG. 1 is a block diagram of a dual-path clock-delay circuit 10 of the present invention. A PRF clock signal or pulse sequence from PRF generator (oscillator) 12 is input to the circuit and drives a reference delay element 14 and a variable delay element 16. The reference delay element 14 is typically a fixed delay and the variable delay element 16 is responsive to voltage at its control port. Both delay elements 14, 16 are active immediately after the positive (+) transition (leading edge) of the PRF clock pulse. That is, they produce a positive (+) edge at their outputs (TX CLOCK and RX CLOCK respectively) after a defined delay. Thus the leading edges of the pulses produced by delay elements 14, 16 are separated by the difference in delays between delay elements 14, 16.

The delay elements 14, 16 preferably have an enable input that allows both elements to function only during the positive level of the PRF clock. Thus, the delay elements output a positive edge with timing related to their delay function, and fixed time-coincident negative edges tied to the negative edge of the PRF input clock. Thus the falling or trailing edges of the pulses produced by delay elements 14, 16 are coincident in time (since both delay elements 14, 16 are disabled or shut off at the same time.)

The reference delay element 14 outputs a square wave with about 50% duty cycle. The variable delay element 16 outputs a variable duty cycle waveform, depending on the control port voltage, that varies from about 70% to 30% duty cycle, with 50% duty cycle being normal with no control voltage input.

The waveforms produced by the delay elements 14, 16 are integrated by integrators 18, respectively to produce DC voltages scaled by the common 5-volt (or other voltage) power supply. These DC voltages precisely reflect the location of the positive edges of the delay element outputs. The DC voltages are applied to a differencing amplifier 22, whose output is connected to the control port of the variable delay element 16.

Voltage summation elements (or networks) 24, 26 located ahead of the differencing amplifier 22 allow injection of external control voltages. In the absence of these control voltages, the differencing amplifier 22, which generally has extremely high gain and is connected in a negative feedback configuration, will stabilize with exactly zero volts difference at its input terminals. This occurs when the duty cycle at the output of the variable delay element 16 precisely matches the duty cycle at the output of the reference delay element 14, generally at 50% each, regardless of the exact magnitude of the 5-volt power supply.

When external control voltages are applied to the RANGE OFFSET or RANGE RAMP inputs, the duty cycle at the variable delay output must adjust to maintain loop equilibrium. Since the variable delay output duty cycle is precisely related to its positive edge delay, the positive edge delay is precisely controlled by the external voltage inputs. Normally, the RANGE RAMP input is a 0 to 5-volt linear ramp input derived from a DAC or a precision linear ramp circuit. In either case, the RANGE RAMP input voltage must scale, or track, with the 5-volt power supply to track the integrator output levels.

The RANGE OFFSET is a control port for injecting an offset voltage that offsets the relative delay between the radar transmit (TX) clock and receive (RX) clock provided at the output of the circuit. The RANGE RAMP and RANGE OFFSET inputs can be reversed provided the polarities of these input voltages are reversed as well.

Figure 2:
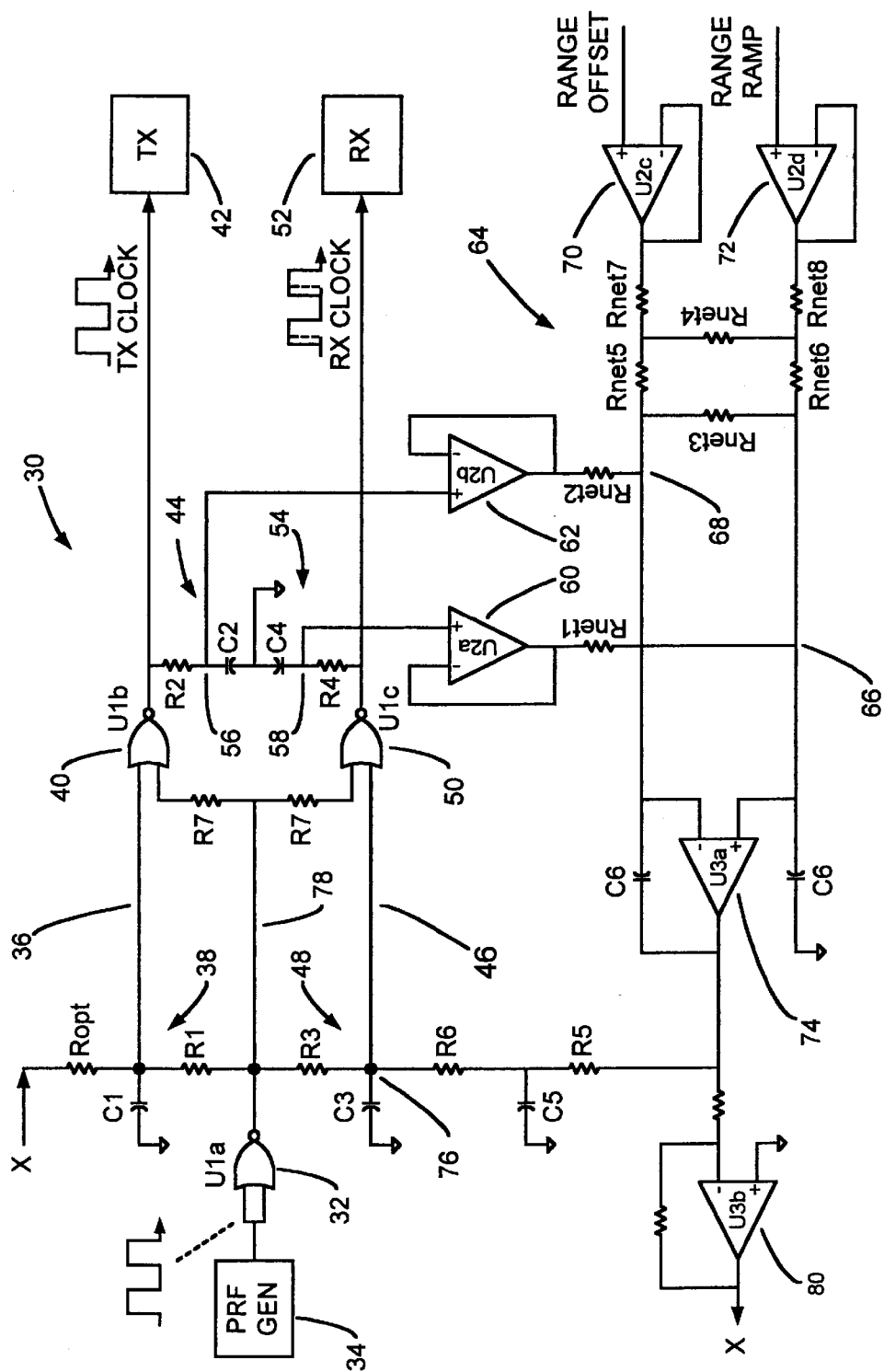
FIG. 2 is a detailed schematic of a preferred embodiment of the present invention.

FIG. 2 is a detailed schematic of a preferred embodiment 30 of the present invention. A PRF clock signal or pulse sequence is applied to a NOR gate (U1a) 32 acting as a buffer from the PRF clock oscillator (generator) 34. The NOR gate 32 output drives an upper, fixed delay path 36 comprised of a resistor-capacitor R1C1 (1K, 10 pF) delay network 38. The fixed delay path 36 is connected to one input of a NOR gate (U1b) 40 which shapes the edges of the fixed delay clock signal and outputs the reshaped pulse to the system transmitter (TX) 42 and to an integrator 44 comprised of a 10 kΩ resistor R2 and a 220 pF capacitor C2. A threshold comparator can be used as a buffer in place of NOR gate 40. A low pass filter can be used in place of R2C2 integrator 44.

Similarly, the NOR gate 32 output drives a lower, variable delay path 46 comprised of a resistor-capacitor R3C3 (1K, 47 pF) delay network 48. The variable delay path 46 is connected to one input of a NOR gate (U1c) 50 which shapes the edges of the variable delay clock signal and outputs the reshaped pulse to the system receiver (RX) 52 and to an integrator 54 comprised of a 10 kΩ resistor R4 and a 220 pF capacitor C4. A threshold comparator can be used as a buffer in place of NOR gate 50. A low pass filter can be used in place of R4C4 integrator 54.

Both the TX and RX system elements 42, 52 trigger on the positive edges of the TX and RX clocks, respectively.

The integrator 44, 54 outputs at nodes 56, 58 are applied to the positive inputs of buffer operational amplifiers (op amps U2a and U2b) 60, 62 to unload the integrators 44, 54 and eliminate a possible error source. The negative inputs of op amps 60, 62 are connected to their outputs to form unity gain buffers. It should be noted that the integrator time constants have no effect on circuit accuracy provided the integrators adequately remove ripple at the PRF clock frequency. If the integrator time constants are excessive, the dynamics of the control loop will be affected, but not the static accuracy of the circuit. The outputs of the buffer op amps 60, 62 are DC voltages corresponding to the duty cycles of their respective inputs, i.e., the precise delays of the upper and lower paths 36, 46.

The buffer outputs are applied to a precision voltage summing network 64, comprised of eight resistors Rnet1 . . . Rnet8. These Rnet resistors are precision monolithic tantalum nitride thin film resistors deposited on a common substrate in a 16-pin SMT package, such as the Panasonic 2NBS16-TF1-203 network, each resistor having a value of 20 kΩ. Tests show these resistors track to better than 1 ppm over a wide temperature range. A primary advantage of ladder network 64 is that all the resistors can be of the same value for best temperature tracking. Tight temperature tracking is needed to preserve a precise scale factor of input control voltage versus delay time between the TX and RX output ports. As an alternative, conventional resistors may be used in a simple summing arrangement, instead of the Rnet ladder network 64 seen in FIG. 2.

The output of buffer amp 60 passes through Rnet1 to node 66 and the output of buffer amp 62 passes through Rnet2 to node 68. The external control voltages RANGE OFFSET and RANGE RAMP are applied to the inputs of buffer op amps (U2c, U2d) 70, 72 respectively. The outputs of op amps 70, 72 pass through network 64 and are summed with the outputs of op amps 60, 62 respectively at nodes 66, 68.

The Rnet network outputs at nodes 66, 68 are applied to the two input terminals of a differential operational amplifier (U3a) 74, such as a TLO74 op amp by Texas Instruments. Op amp 74 compares the output voltage from Rnet network 64 and forces its input terminal voltages to match, by virtue of its high gain and negative feedback configuration. Operational amplifier 74 is stabilized with 220 pF capacitors C6, resulting in a loop settling time on the order of 5 μs.

The output of amplifier 74 is buffered by a 100 Ω resistor R5 and a 1000 pF bypass capacitor C5. The 1000 pF bypass capacitor C5 prevents clock voltages from coupling into the op amp 74 from the RC delay network and upsetting its operation. The control port is implemented with a single 1 KΩ resistor R6, which injects voltage into the 1 KΩ, 47 pF R3C3 node 76 in the variable delay path 46. The injected voltage offsets the slow risetime waveform at this node, thereby controlling the time it takes the waveform to reach the threshold of the NOR gate 50. Thus a variable delay function is implemented with very low jitter, very low component count, and very low cost.

The enable line 78 connected from NOR gate 32 to the second inputs of NOR gates 40, 50 must swing low to enable the passage of clock edges from the fixed and variable delay paths 36, 46. The enable path 78 has very little propagation delay, so it immediately enables the gates 40, 50 for the delayed negative transitions from the fixed and delayed paths 36, 46. Once both NOR gate inputs go low, the gate output goes high, producing the active timing edge used by the system at the TX and RX ports. When the enable line goes high, both NOR gates 40, 50 go low regardless of the level of the fixed and variable delay paths 36, 46. Thus, the relative output pulse widths from NOR gates 40, 50 depend entirely on the relative delays of the fixed and variable paths 36, 46. The 100 Ω resistors R7 at the enable inputs of NOR gates 40, 50 damp low level ringing that could reduce accuracy. The resistor values are dependent on the physical layout of the circuit and may not always be needed.

Figure 3:
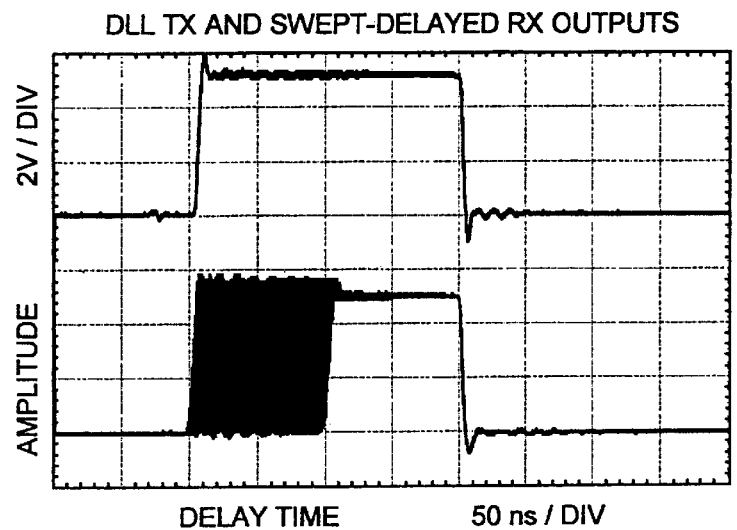
FIG. 3 plots the TX (upper) and RX (lower) clock output waveforms of FIG. 2 with a 5-volt ramp applied to the RANGE RAMP input.

FIG. 3 plots the TX (upper) and RX (lower) clock output waveforms of FIG. 2 with a 5-volt ramp applied to the RANGE RAMP input. The positive edge of the lower trace indicates the swept delay operation of the circuit, as it can be seen spread across a 100 ns range in this time lapse plot.

Figure 4:
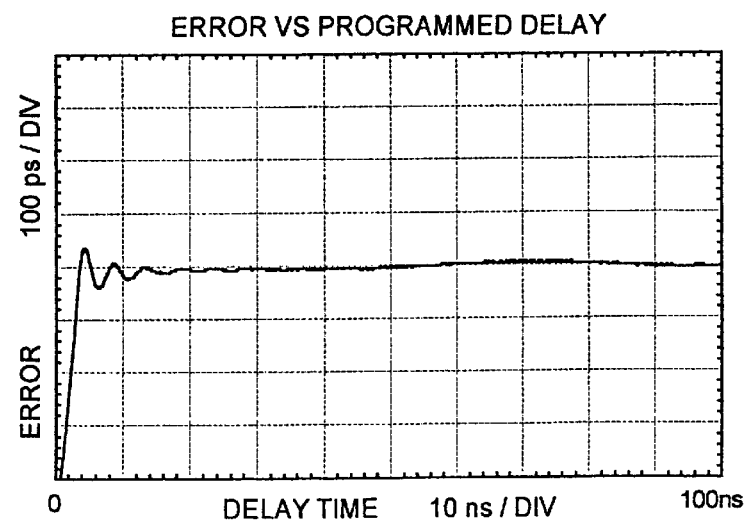
FIG. 4 is a plot of delay error versus the expected delay with a 5-volt ramp applied to the RANGE RAMP input of FIG. 2.

FIG. 4 is a plot of delay error versus the expected delay with a 5-volt ramp applied to the RANGE RAMP input of FIG. 2. As can be seen, the error is less than 10 ps out of a 100 ns swept range, or less than 0.01% of full scale. The error seen at the extreme left of the plot is a control loop settling error that occurs immediately after the RANGE RAMP is reset.

While the leading edge of the TX pulse is fixed, and the leading edge of the RX pulse sweeps through a range of delays, as shown in FIG. 3, it is also possible to sweep both in a push-pull configuration. The leading edge of the TX pulse will then sweep in the opposite direction to the RX pulse so the relative delay is doubled. To implement the push-pull operation, the output of op amp 74 is input into an op amp 80 (U3b) configured as an inverter. The inverted output signal X is applied to the optional control port, which is connected through Ropt to the fixed delay path 36.

The invention can be used for precision timing applications in a wide variety of systems, including wideband pulsed radar rangefinders, pulsed laser rangefinders, and time domain reflectometers (TDRs). The system transmitter TX 42 of FIG. 2 is then the transmitter of the radar, laser, or TDR system, and the system receiver RX 52 is the receiver of the radar, laser, or TDR system. In a radar rangefinder, the transmitter TX generates a sequence of pulses which are directed to a target, and the TX clock pulses control the transmitted pulses. A swept range gated receiver, controlled by the RX clock pulses, receives reflected signals from the target and determines range. In a laser rangefinder, the operation of the clock delay circuit is similar, but the transmitter produces laser pulses and the receiver receives reflected laser pulses. In a TDR system, the transmitter applies pulses to a guidewire or transmission line which extends into a material, e.g. liquid in a tank. The swept range gated receiver determines the range at which the transmit pulses are reflected back by the material.

Changes and modifications in the specifically described embodiments can be carried out without departing from the scope of the invention which is intended to be limited only by the scope of the appended claims.

What is claimed is:

1. A high-speed clock delay circuit comprising:
   first and second delay elements, each having an input connected to a common clock input,
   first and second integrators connected to the first and second delay element outputs respectively,
   a differencing amplifier having first and second inputs connected to the first and second integrator outputs respectively,
   a control loop connected from the output of the differencing amplifier to a control port of one of the delay elements.

2. The circuit of claim 1 further comprising an enable path connected to each of the delay elements.

3. The circuit of claim 1 wherein the first delay element is a reference delay element and the second delay element is a variable delay element.

4. The circuit of claim 3 wherein the output of the differencing amplifier is connected to the variable delay element.

5. The circuit of claim 1 wherein the first and second delay elements are RC networks.

6. The circuit of claim 5 further comprising a logic gate or threshold comparator connected to each RC network.

7. The circuit of claim 1 wherein the first and second integrators are RC networks or low pass filters.

8. The circuit of claim 1 further comprising a voltage summation network connected between the first and second integrators and the differencing amplifier.

9. The circuit of claim 8 wherein the voltage summation network comprises a monolithic resistor network having a pair of inputs connected to the outputs of the first and second integrators.

10. The circuit of claim 9 wherein the monolithic resistor network has at least a third input connected to an external range control voltage input.

11. The circuit of claim 9 wherein the monolithic resistor network has a pair of additional inputs connected to a pair of external range control voltage inputs.

12. The circuit of claim 1 wherein the differencing amplifier comprises a stabilized operational amplifier.

13. The circuit of claim 1 further comprising a voltage inverter connected between the output of the differencing amplifier and a control port connected to the other delay element.

14. The circuit of claim 1 further comprising a radar transmitter connected to the output of the first delay element and a radar receiver connected to the output of the second delay element.

15. The circuit of claim 1 further comprising a laser transmitter connected to the output of the first delay element and a laser receiver connected to the output of the second delay element.

16. The circuit of claim 1 further comprising a TDR transmitter connected to the output of the first delay element and a TDR receiver connected to the output of the second delay element.

17. A method for generating a relative clock delay, comprising:

passing a sequence of common clock pulses through first and second delay elements;

producing from each delay element a sequence of output pulses, each output pulse having one common edge and one delay-dependent edge;

obtaining average voltages related to the duty cycle of the series of output pulses from the delay elements;

controlling the delay between the first and second delay elements by regulating the average voltages.

18. The method of claim 17 wherein the delay between the first and second delay elements is controlled by applying at least one of a voltage ramp and an offset voltage.

19. The method of claim 17 wherein the step of obtaining average voltages is performed by passing the sequence of output pulses through an integrator.

20. The method of claim 17 further comprising applying the output pulses to drive a radar, laser, or TDR system.

* * * * *